United States Patent
Schroeck

(10) Patent No.: US 10,907,271 B2
(45) Date of Patent: Feb. 2, 2021

(54) METHOD FOR PULLING A SINGLE CRYSTAL BY THE FZ METHOD COMPRISING DYNAMICALLY ADAPTING THE POWER OF A MELTING APPARATUS BASED ON A POSITION OF LOWER AND UPPER PHASE BOUNDARIES

(71) Applicant: SILTRONIC AG, Munich (DE)

(72) Inventor: Thomas Schroeck, Kastl (DE)

(73) Assignee: SILTRONIC AG, Munich (DE)

( * ) Notice: Subject to any disclaimer, the term of this patent is extended or adjusted under 35 U.S.C. 154(b) by 20 days.

(21) Appl. No.: 16/473,388

(22) PCT Filed: Jan. 31, 2018

(86) PCT No.: PCT/EP2018/052352
§ 371 (c)(1),
(2) Date: Jun. 25, 2019

(87) PCT Pub. No.: WO2018/149640
PCT Pub. Date: Aug. 23, 2018

(65) Prior Publication Data
US 2020/0141025 A1    May 7, 2020

(30) Foreign Application Priority Data
Feb. 14, 2017    (DE) .......................... 10 2017 202 311

(51) Int. Cl.
*C30B 13/20*    (2006.01)
*C30B 15/36*    (2006.01)
(Continued)

(52) U.S. Cl.
CPC ............... *C30B 15/36* (2013.01); *C30B 13/30* (2013.01); *C30B 29/06* (2013.01)

(58) Field of Classification Search
CPC ......... C30B 13/00; C30B 13/16; C30B 13/20; C30B 13/28; C30B 13/30; C30B 15/00;
(Continued)

(56) References Cited

U.S. PATENT DOCUMENTS

2010/0107968 A1    5/2010    Vaabengaard et al.

FOREIGN PATENT DOCUMENTS

| CN | 101680108 A | 3/2010 |
|---|---|---|
| CN | 103436951 | 12/2013 |

(Continued)

*Primary Examiner* — Kenneth A Bratland, Jr.
(74) *Attorney, Agent, or Firm* — Brooks Kushman P.C.

(57) ABSTRACT

A single crystal is pulled by the FZ method, in which in a first phase, a lower end of the polycrystal is melted by the melting apparatus, in a second phase, a monocrystalline seed is attached to the lower end of the polycrystal, and in a third phase, between a lower section of the seed and the polycrystal, a thin neck section is formed whose diameter is smaller than that of the seed, where the power of the melting apparatus before the third phase is dynamically adapted in dependence on a position of a lower phase boundary ($P_U$) between liquid material and solid material on the part of the seed, and where the power of the melting apparatus during the third phase is dynamically adapted in dependence on the position of an upper phase boundary ($P_O$) between liquid material and solid material on the part of the polycrystal plant.

11 Claims, 5 Drawing Sheets

(51) Int. Cl.
 *C30B 13/30* (2006.01)
 *C30B 29/06* (2006.01)
(58) Field of Classification Search
 CPC ......... C30B 15/30; C30B 15/36; C30B 29/00; C30B 29/02; C30B 29/06
 USPC .......... 117/11, 37–39, 49–52, 200, 206, 208, 117/928, 931, 933
 See application file for complete search history.

(56) References Cited

FOREIGN PATENT DOCUMENTS

| | | |
|---|---|---|
| DE | 102010040464 A1 | 3/2012 |
| JP | 11189486 A | 7/1999 |
| JP | 2000-44380 A | 2/2000 |
| JP | 2000044380 A * | 2/2000 |
| JP | 4016363 B2 | 9/2007 |
| JP | 2010-076979 A | 4/2010 |
| JP | 2011-37640 A | 2/2011 |
| JP | 2016-023099 A | 2/2016 |
| WO | 2014033212 A1 | 3/2014 |

* cited by examiner

METHOD FOR PULLING A SINGLE CRYSTAL BY THE FZ METHOD COMPRISING DYNAMICALLY ADAPTING THE POWER OF A MELTING APPARATUS BASED ON A POSITION OF LOWER AND UPPER PHASE BOUNDARIES

CROSS REFERENCE TO RELATED APPLICATIONS

This application is the U.S. National Phase of PCT Appln. No. PCT/EP2018/052352 filed Jan. 31, 2018, which claims priority to German Application No. 10 2017 202 311.2 filed Feb. 14, 2017, the disclosures of which are incorporated in their entirety by reference herein.

BACKGROUND OF THE INVENTION

1. Field of the Invention

The present invention relates to a method for pulling a single crystal by the FZ method, in which a polycrystal is melted by means of an electromagnetic melting apparatus and then recrystallized, and also to a corresponding plant.

2. Description of the Related Art

In the pulling of single crystals, particularly those of semiconductor material, by the FZ method, the so-called floating zone method or zone melting method, it is possible to generate single crystals of high purity. In this method, a polycrystal, in other words a crystal made of polycrystalline semiconductor material, is melted and then recrystallized.

In such a process, there are different phases that can be distinguished, as they are described in WO 2014/033212 A1, for example. The polycrystal in this case is first of all melted and then recrystallized on a monocrystalline seed.

To start with, the diameter of the monocrystal to be fabricated is reduced from approximately the diameter of the seed, in what is called a thin neck section, and is subsequently widened to a desired diameter in a conical section. The diameter can then be kept constant in order to give, for example, a monocrystal in rod form.

Known from JP 4 016 363 B2, for example, is an FZ method wherein four different cameras are used to record different regions of the polycrystal, of the seed attached thereto, and of the liquid or molten material located between them. From these recordings, determinations are then made not only of diameters of the polycrystal and of the monocrystal but also of a height of the region or the zone of the liquid or molten material, referred to as the zone height.

Based on this height, a power for the induction coil by means of which the polycrystal is melted is then adapted dynamically, in order thus in particular to form the aforementioned thin neck section. It is also possible for a lowering velocity of the seed and/or of the polycrystal to be set or adapted.

A disadvantage of the aforementioned approach, however, is the numerous cameras required in order to capture the regions on the basis of which the zone height is then determined.

Against this background, therefore, the object is that of providing an easier and more precise means of adapting the power of the melting apparatus in order thus in particular to allow the operation to be automated.

SUMMARY OF THE INVENTION

The invention provides a method for pulling a single crystal by the FZ method in which a polycrystal is melted by means of an electromagnetic melting apparatus and then recrystallized, comprising:
in a first phase ($P_1$), melting a lower end of the polycrystal by means of the melting apparatus,
in a second phase ($P_2$), attaching a monocrystalline seed to a lower end of the polycrystal, and
in a third phase ($P_3$), forming a thin neck section between a lower section of the seed and the polycrystal, where the diameter ($d_D$) of the thin neck section is smaller than the diameter ($d_f$) of the seed,
dynamically adapting a power of the melting apparatus before the third phase ($P_3$) at least temporarily in dependence on a position of a lower phase boundary ($P_U$) between liquid material and solid material on the seed,
dynamically adapting the power of the melting apparatus during the third phase ($P_3$) at least temporarily in dependence on a position of an upper phase boundary ($P_O$) between liquid material and solid material on the part of the polycrystal, and directly performing a change in the dependence of the power of the melting apparatus from the position of the lower phase boundary ($P_U$) to dependence on the position of the upper phase boundary ($P_O$).

DETAILED DESCRIPTION OF THE PREFERRED EMBODIMENTS

Figure 1:
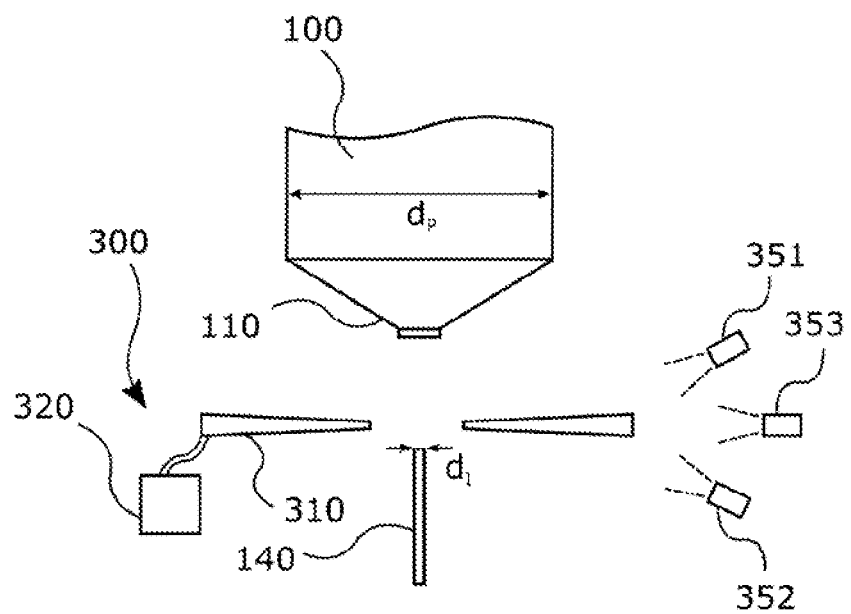
FIG. 1 shows, schematically, a polycrystal and a melting apparatus with which a method of the invention can be implemented.

Proposed in accordance with the invention are a method and a plant for pulling a single crystal, by the FZ method, in which a polycrystal is melted by means of an electromagnetic melting apparatus and then recrystallized. Material eligible for the polycrystal and hence also for the monocrystal to be fabricated is, in particular, a semiconductor material, preferably silicon. It will be understood that the material may also include certain impurities or dopants.

In a first phase, the polycrystal, which as a general rule is in the form of a rod having a diameter of 160 mm, for example, is first melted by means of a melting apparatus, beginning at a lower end (in relation to gravity in the case of vertical disposition of the rod-shaped polycrystal). A melting apparatus contemplated here in particular is an inductor or an induction coil. In this case, by means of radiofrequency excitation, electromagnetic energy can be coupled into the polycrystal, which is brought into the vicinity of the inductor.

In the first phase, the polycrystal, which as a general rule is conical at its lower end, optionally with a shallow lower section, can be lowered and brought up to a central hole in the inductor. In order to maximize the amount of electromagnetic energy coupled into the polycrystal, it is useful to bring the lower end of the polycrystal up to the edge of the hole. The polycrystal then begins to melt at the lower end, with the formation initially of a drop of liquid material hanging from the polycrystal.

Then, in a second phase, a monocrystalline seed, which in particular is likewise rod-shaped and has a diameter of about 4 to 7 mm, for example, is attached to the lower end of the polycrystal and hence to the drop of liquid material, and is then melted, preferably beginning from an upper end of the seed. The melting of the seed generally begins only after the temperature of the seed has adjusted itself to that of the material that is already liquid. The seed may usefully be melted over a certain region of its length, a length which may be, for example, between 5 and 20 mm. It will be understood, however, that a certain region at its lower end is not melted, since this section is required at least in part for fixing in a pulling apparatus. For the melting of the seed, the seed and the polycrystal are moved upward. This means, for example, that the seed is moved in the direction of the hole in the inductor. In this procedure, a preliminary seed is formed at the lower end of the polycrystal. A preliminary seed in this context is a region, more particularly in the form of a plug, at the lower end of the polycrystal, on which the seed is then attached.

In a third phase, then, between a lower section of the seed (at which the seed may be held, for example, in the aforementioned pulling apparatus) and the polycrystal (that is, the portion of the polycrystal which is still solid and has not yet melted), a thin neck section is formed whose diameter is smaller than that of the seed. This thin neck section is formed in order to remove any dislocations which form, for example, as a result of the attaching of the seed to the liquid material on the polycrystal. The diameter of the thin neck section here may for example be between 2 and 4 mm. In order to form this thin neck section, the seed and the polycrystal, after the seed has been melted as desired, can be moved downward again. By now increasing the lowering velocity of the seed, there is a decrease in the diameter of the zone of liquid material, or of the material which then crystallizes, owing to the conservation of mass.

After the thin neck section, the diameter of the monocrystal can then be increased to a desired diameter of, for example, around 200 mm and then retained. These phases will be addressed again in more detail later on.

With regard to the formation of the thin neck section, in other words during the third phase, the problem then arises that electromagnetic energy which is to be coupled into the solid material by means of the melting apparatus is incoupled into the material only with difficulty below a thickness of material of around 4 mm. The reason for this is that the free path length for the induced current becomes too short.

This in turn leads to more rapid crystallization and to an associated change in the height and/or distance of the lower phase boundary from the inductor, hence to a change in the diameter, and therefore, again, to a change in the incoupled energy. In other words, the distance of the lower phase boundary from the inductor tends to oscillate in an uncontrolled way. In addition, the amount of the incoupled energy or power is also generally dependent on other parameters, such as the initial dimensions of the seed and of the polycrystal, and also on the dimensions and the orientation of the melting apparatus or the inductor. Consequently, when a particular value or a particular profile is mandated for the power of the melting apparatus, the targeted formation of a desired thin neck section in this situation is barely possible. The overall height between the two phase boundaries, as is the case in the methods referred to at the outset, is therefore not a variable which can be used in order to perform effective regulation.

In accordance with the invention, then, the power of the melting apparatus before the third phase, and in particular during the second phase, is dynamically adapted, at least temporarily, in dependence on a position of the lower phase boundary between liquid material and solid material on the part of the seed, i.e., the power is suitably altered or regulated in dependence on the position, for example, over time. Additionally, during the third phase, the power of the melting apparatus is then dynamically adapted, at least temporarily, in dependence on a position of the upper phase boundary between liquid material and solid material on the part of the polycrystal.

It is useful in this context to use the respective position or a variable in correlation therewith as a regulating variable, and to use the power of the melting apparatus, accordingly, as a controlled variable. A variable eligible as a variable in correlation with the respective position is preferably a distance of the respective phase boundary from a fixed reference point, located in particular on the melting apparatus. Since the phase boundary in the circumferential direction is generally not linear, an averaging over, for example, a capturable range is particularly eligible here. The reference points in this context may be different or identical. This allows the position of the respective phase boundary to be simply captured, especially if the entire operation is recorded by means of one or more cameras. Useful here are a camera disposed in particular below the melting apparatus, for the lower phase boundary, and a camera disposed in particular above the melting apparatus, for the upper phase boundary. The pictures captured by the cameras can then be evaluated (automatedly) accordingly in order to obtain the necessary positions or distances, respectively.

During the melting of the seed in the second phase, the diameter of the material is sufficiently large, and so electromagnetic energy can be readily incoupled, and consequently, the position of the lower phase boundary can be used as a good indicator for determining the power of the melting apparatus. At a defined rate at which the seed (and the polycrystal) are displaced (raised, in particular, during melting of the seed), therefore, the power of the melting apparatus may be dynamically adapted in such a way, for example, that the position of the lower phase boundary or the distance thereof from a reference point remains very largely constant or follows a predetermined curve.

During the formation of the thin neck section, in contrast, the position of the lower phase boundary is not a good indicator for determining the power of the melting apparatus any longer, since—as mentioned—at low diameters the electromagnetic energy is coupled only poorly into the material, the crystallization rate changes sharply as well, and hence the position of the lower phase boundary fluctuates very sharply. The longer the position of the lower phase boundary is used for adapting the power of the melting apparatus, the greater this effect would increase.

The position of the upper phase boundary, in contrast, serves as a good indicator for determining the power of the melting apparatus during the formation of the thin neck section, since at that point, in other words at the lower end of the solid polycrystal, the diameter of the material is sufficiently large, and so electromagnetic energy is incoupled well. There, in other words, the change in the phase boundary is not uncontrolled.

Accordingly, it is possible in this way to provide a dynamic adaptation of the power of the melting apparatus not only during the melting of the seed but also for the formation of the thin neck section. For the uninterrupted, precise adjustment or adaptation of power, it is useful if a change in the dependence on the position of the lower phase boundary is performed directly to the dependence on the position of the upper phase boundary. As the timing for this change, a time point before an increase in a rate at which the seed and/or the polycrystal are moved in the vertical direction is particularly eligible. Alternatively, however, a certain temporal overlap in the use of the two variables is also conceivable, in order to keep the transition stable. If the thin neck section is to be formed after the melting of the seed, a reversal of the movement direction of seed and polycrystal is needed first of all, i.e., the two must be lowered. In order to form the thin neck section, in addition—as already mentioned—an increase in the rate, more particularly the lowering rate, is then necessary, in order to reduce the diameter. If, then, the change in the position in dependence on which the power is adapted is performed before this increase in the rate, more particularly immediately before it as well, there is no risk of the power being falsely adapted because of the poor incoupling of the electromagnetic energy.

In a fourth phase in the context of the FZ method, a conical section can then be formed between the thin neck section and the polycrystal. A conical section of this kind serves to widen the diameter from that of the thin neck section to a desired diameter. During the fourth phase, then, the power of the melting apparatus is preferably dynamically adapted, at least temporarily, in dependence on a characteristic variable which can be used to deduce an angle of inclination of the conical section or the change therein. Contemplated as a characteristic variable of this kind is, in particular, the angle of inclination of the conical section of crystallized material, an angle of inclination of the conical section at a triple point between solid material, liquid material, and surroundings, a change in a diameter of the conical section, or the diameter of the conical section at the lower phase boundary (which at that point is already located between the conical section of the monocrystal and the liquid material); in the case of the latter, an adaptation of a regulator structure used may possibly be necessary. By means of each of these variables as a basis for the adaptation of the power, it is possible to achieve a desired form of the cone, in other words, in particular, a desired angle of inclination. It will be understood that a lowering rate of the seed (together with the material already crystallized thereon) and of the polycrystal must also be altered in order to increase the diameter. In particular, a reduction in the lowering speed means that a greater amount of material is able to crystallize, hence increasing the diameter.

As was already the case for the change from the position of the lower phase boundary to that of the upper phase boundary, it is an advantage here as well to perform a change in the dependence on the position of the upper phase boundary directly to the dependence on the characteristic variable. In this way, uninterrupted adaptation of the power is possible. Conceivable here as well, however, again, is a certain temporal overlap during which the power is adapted in dependence on the position of the upper phase boundary and in dependence on the characteristic variable.

As the timing for this change, a time point contemplated is, in particular, that at which recognition of the position of the upper phase boundary is subsequently possible only with less than a predetermined accuracy. In the formation of the conical section, the increasing diameter of the polycrystal which is melted means that more and more material of the polycrystal has to be melted. In this case, the upper phase boundary, namely the boundary between solid and liquid silicon, becomes less sharply defined, and at some point in time, therefore, it is no longer possible with sufficient accuracy to determine this boundary in order, based thereon, to adapt the power of the melting apparatus.

It is useful here as well if a camera, disposed in particular below the melting apparatus, is used for determining the characteristic variable. For this purpose it is possible in particular to use the camera which is already being used for capturing the lower phase boundary. The images captured by the camera can then be evaluated (automatedly) accordingly in order to obtain the necessary variable.

A further subject of the invention is a plant which is equipped for implementing the method of the invention. The plant for this purpose may comprise in particular a melting apparatus, of the kind already mentioned multiply, for example, and also a suitable arithmetic unit. The arithmetic unit may then be equipped accordingly to implement the individual method steps and also, for example, to drive the cameras accordingly and evaluate their images.

In order to avoid repetition, reference may otherwise be made to the above elucidations concerning the method of the invention, with regard to further embodiments and also to the advantages of the plant.

Further advantages and embodiments of the invention will be apparent from the description and the appended drawing.

It will be appreciated that the features identified above and those still to be elucidated hereinafter can be used not only in the particular combination indicated but also in other combinations, or on their own, without departing from the scope of the present invention.

The invention is illustrated schematically in the drawing by an exemplary embodiment, and is described below with reference to the drawing.

Illustrated in a side view in FIG. 1, schematically are a polycrystal 100 and a melting apparatus 300 with which a method of the invention can be implemented. The melting apparatus 300 here has an inductor or an induction coil 310, which can be driven or operated correspondingly with radiofrequency, for example, by means of a drive unit 320 which is connected via corresponding lines.

This melting apparatus 300 may in this case be part of a plant which is equipped for the pulling of a single crystal. A plant of this kind may then also have corresponding holding devices for the inductor 300, the single crystal 100, and the cameras 351, 352 and 353. Furthermore, a plant of this kind may have an arithmetic unit (not shown) for controlling the other constituents.

The polycrystal 100, which in particular may comprise or consist of silicon, is predominantly rod-shaped or cylindrical. In the rod-shaped or cylindrical region, of which only part is shown here, the polycrystal 100 has a diameter $d_P$ which may be, for example, 160 mm. At its lower end, however, the polycrystal 100 is conical in shape, thus having a conical section 110. It can be seen, furthermore, that the conical section 110 in turn may have a shallow end at its lower end.

If the polycrystal has not been machined, but instead comes, for example, from a melting operation not completed, this lower end may also have a different form.

Furthermore, a seed 140 can be seen which has a diameter $d_I$ which may be, for example, 4 to 7 mm. The seed is a monocrystal which may likewise be rod-shaped or cylindrical in form.

Figure 2:
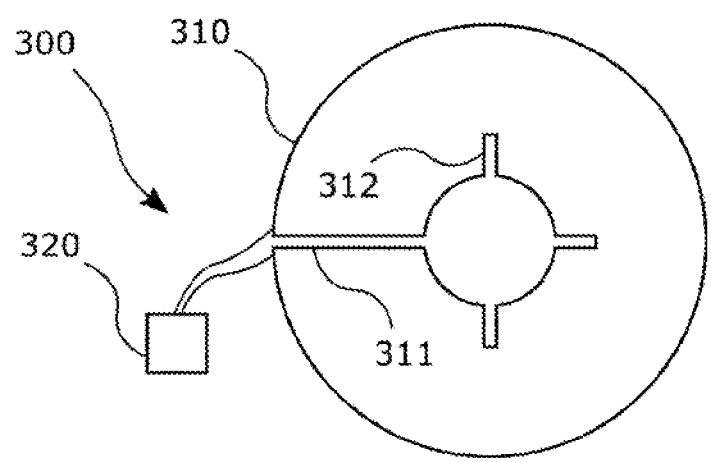
FIG. 2 shows the melting apparatus from FIG. 1 in a different view.

Illustrated in FIG. 2 is the melting apparatus 300 from FIG. 1 in a different view, in this case a plan view, albeit without the polycrystal 100. Clearly visible, is a recess or a hole in the middle of the inductor 310, through which the polycrystal is guided—during the melting operation and then in the liquefied state.

Visible in particular, is a primary slot 311 and also three ancillary slots 312, needed for the function of the melting apparatus, more particularly for generation of the electromagnetic energy. As can be seen, the inductor is not closed, because of the primary slot 311.

FIGS. 3a to 3f then show, schematically, different phases of a method of the invention in one preferred embodiment. The process of the method will be elucidated in more detail below with reference to FIGS. 3a to 3f and also to FIG. 4, which shows the rates $v_P$ of the polycrystal and vi of the seed in the individual phases over the time t.

In a first phase $P_1$ the polycrystal 100 is first brought up to the inductor 310 or the recess in its center. For this purpose, for example, the polycrystal is lowered at a constant rate. The seed 140 here need not as yet be moved. Contrary to the orientation shown here, the polycrystal 100 may also be brought closer to an inner edge of the inductor 310, in order to allow more effective coupling of the electromagnetic energy into the polycrystal 100.

Figure 3A:
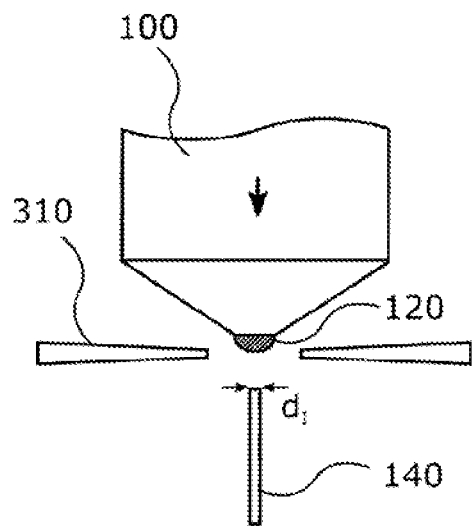
FIGS. 3a to 3f show, schematically, different phases of a method of the invention in one preferred embodiment.
Figure 4:
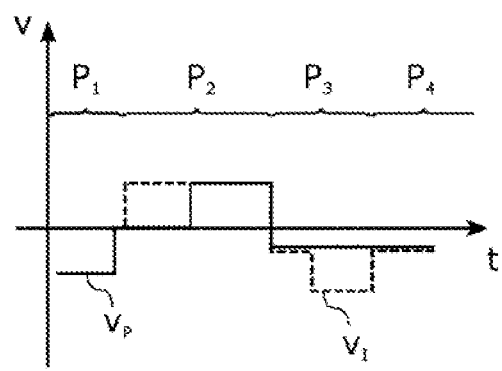
FIG. 4 shows a temporal sequence of a method of the invention in one preferred embodiment.

The polycrystal 100 thus begins to melt at its lower end, hence including the lower end of the conical section. In this case, a drop 120 of liquid material which hangs from the polycrystal is formed, as can be seen in FIG. 3a. Here and in the following figures, liquid material is shown with hatching, whereas solid material is shown white or to without hatching.

Figure 3B:
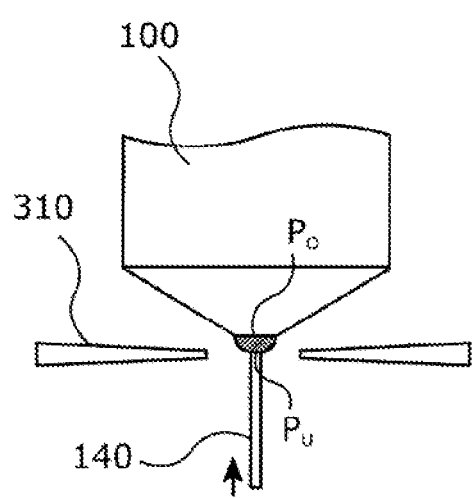

In a second phase $P_2$, the seed 140 is then attached to the lower end of the polycrystal 100 and hence to the drop 120 of liquid material, as can be seen in FIG. 3b, and is melted beginning from an upper end of the seed 140. For this purpose, the seed is first of all moved toward the polycrystal 100, in other words upward, at a defined rate, for example, while the polycrystal 100 may be at rest. The melting of the seed 140 in this case generally begins only after the temperature of the seed 140 has equalized with that of the already liquid material.

Figure 3C:
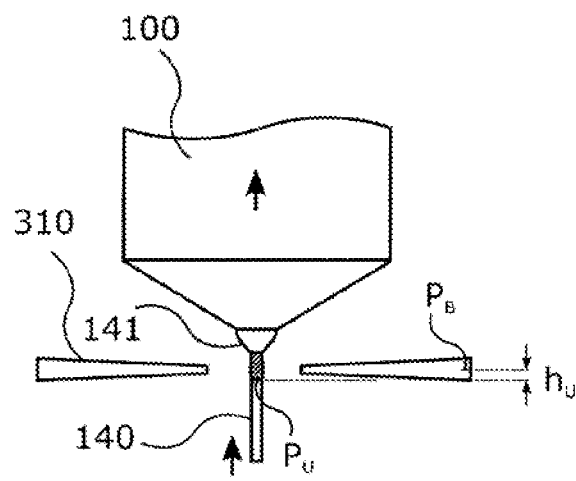

When the seed 140 is attached to the drop of liquid material at the lower end of the polycrystal 100 and has melted with it, the polycrystal 100 and the seed 140 are jointly moved upward, as can be seen in FIG. 3c. In this case the preliminary seed 141 is also formed at the lower end of the polycrystal 100. The seed may then be melted over a certain region of its length, between 5 and 20 mm, for example, by the seed being moved in the direction of the hole in the inductor 310.

It will be understood, however, that a certain region at the lower end of the seed 140 will not be melted, since this section is needed for fastening in a pulling apparatus (as part of the aforementioned plant).

The power of the melting apparatus 300 is dynamically adapted during the second phase $P_2$ in dependence on a position of a lower phase boundary $P_U$. This lower phase boundary $P_U$, as can be seen in FIGS. 3b and 3c, is stipulated as the phase boundary between liquid material and solid material on the part of the seed 140.

In particular, then, it is possible for the position of the lower phase boundary $P_U$ relative to a fixed reference point to be determined, in order to capture more easily any change in the lower phase boundary $P_U$. In FIG. 3c, by way of example, the point $P_B$ on the inductor 310 is selected as a fixed reference point. Both the lower phase boundary $P_U$ and the reference point $P_B$ can be captured for this purpose by means of the camera 352, as is shown in FIG. 1. From these measurements it is then possible to determine a (lower) distance $h_U$. It will be appreciated that a different reference point may also be used, in which case care should be taken to ensure that that reference point can likewise be captured accordingly.

This (lower) distance $h_U$ can then be used as a regulating variable, while the power of the melting apparatus 300 is used, correspondingly, as a controlled variable. As can be seen from FIG. 3c, the lower phase boundary can be captured readily during the second phase $P_2$.

In a third phase $P_3$, then, between a lower section of the seed 140 and the polycrystal 100 (that is, the portion of the polycrystal that is still solid and has not yet melted), a thin neck section 130 is formed whose diameter $d_D$, at 2 to 4 mm, for example, is smaller than that of the seed 140. For this purpose, the polycrystal 100 and the seed 140 are first of all moved downward simultaneously, i.e., at the same rate.

Figure 3D:
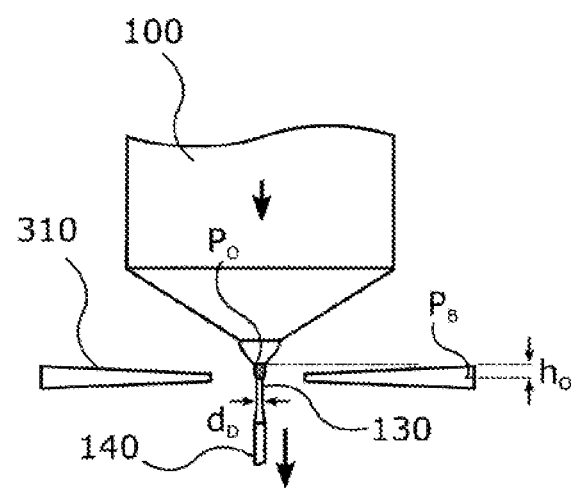

The lowering rate of the seed 140 is then increased at a certain time point relative to that of the polycrystal 100. Therefore, the diameter of the zone of liquid material or of the material which then crystallizes is reduced, owing to the conservation of mass. In FIG. 3d, for example, a thin neck section 130 having a certain length is already formed.

In connection with the formation of the thin neck section 130, then, the problem arises that electromagnetic energy which is to be coupled into the solid and/or liquid material by means of the melting apparatus 300 is coupled into the material only with difficulty below a thickness of material around 4 mm.

Figure 5:
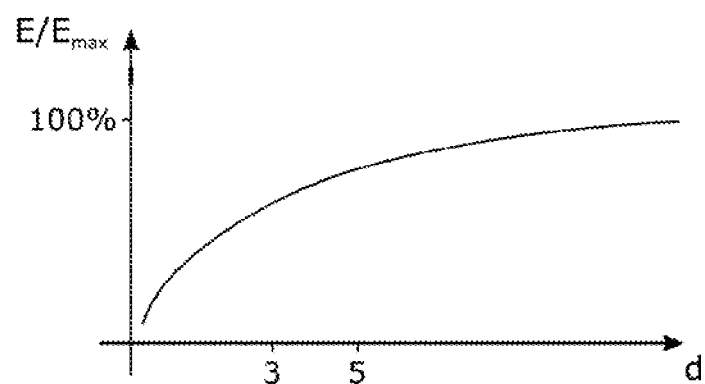
FIG. 5 shows a diagram for the incoupling of electromagnetic energy into semiconductor material.

In FIG. 5, in this regard, a diagram for the coupling of electromagnetic energy into semiconductor material is illustrated. In this figure, a fraction of the incoupled energy E is plotted as a proportion of the total energy $E_{max}$ provided, against the diameter d of the semiconductor material, in mm. From the shape of the curve it is clearly apparent that from just 5 mm, but more particularly from 4 mm, the fraction of incoupled energy becomes increasingly smaller.

Therefore, as soon as the diameter of the material falls below a certain value, there is reduction—assuming predetermined power of the melting apparatus—in the energy coupled into the solid material. This in turn leads to a more rapid crystallization with an associated change in the height and/or the distance of the phase boundary from the inductor, hence to a change in the diameter, and therefore, again, to a change in the incoupled energy.

In addition, the amount of incoupled energy or power is also in general dependent on further parameters such as the initial dimensions of the seed 140 and of the polycrystal 100 and also on the dimensions and the orientation of the melting apparatus 300 or of the inductor 310. Consequently, when a particular value or a particular profile is mandated for the power of the melting apparatus, the formation of a desired thin neck section in this situation is barely possible.

Whereas in the second phase the lower phase boundary $P_U$ or the position thereof is still a good indicator for determining the power of the melting apparatus 300, this is no longer the case in the third phase, more particularly as soon as the thin neck section 130 is present. Because of the poor incoupling of electromagnetic energy, there is also a sharp change in the crystallization rate, and the position of the lower phase boundary therefore fluctuates very sharply. The longer the position of the lower phase boundary $P_U$ is used for adapting the power of the melting apparatus 300, the greater the increase this effect would experience.

In the third phase, therefore, the upper phase boundary $P_O$ and/or the position thereof is used for determining the power, as shown in FIGS. 3b and 3d. Here again, in turn, a distance, in the present case an (upper) distance $h_O$ from the reference point $P_B$ (or else from another reference point) can be used.

Not only the upper phase boundary $P_O$ but also the reference point $P_B$ can be captured for this purpose by means of the camera 351, as is shown in FIG. 1. From these data it is then possible to determine the (upper) distance $h_O$. It will be appreciated that a different reference point may also be used, in which case care should be taken to ensure that that reference point can likewise be captured accordingly.

A change in the position or phase boundary used for regulation may take place preferably before an increase in the lowering rate of the seed 140 relative to that of the polycrystal 100.

Figure 3E:
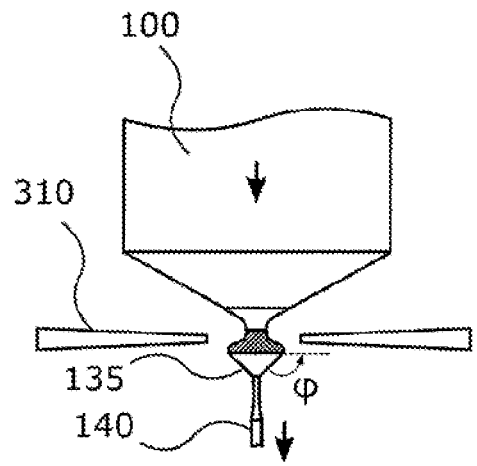
Figure 3F:
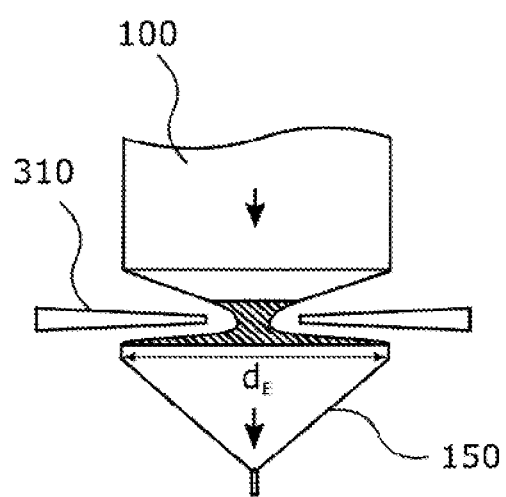

In a fourth phase $P_4$, it is then possible, between the thin neck section and the polycrystal 100, for a conical section 135 to form, as can be seen in FIG. 3e. A conical section 135 of this kind serves to widen the diameter from that of the thin neck section to a desired diameter $d_E$ of, for example, 200 mm of the monocrystal 150 to be fabricated, as can be seen in FIG. 3f.

During the fourth phase $P_4$, the power of the melting apparatus 300 can be dynamically adapted in dependence on an angle $\varphi$ of inclination of the conical section 135. Instead of the angle $\varphi$ of inclination, it would also be possible here to use an angle of inclination at the triple point between solid material, liquid material, and surroundings. Also conceivable, however, are suitable other variables, as already mentioned.

Accordingly it is possible to achieve a desired form of the cone, in other words, in particular, a desired angle of inclination. The angle of inclination may likewise be captured with the camera 352, for example. When the desired diameter $d_E$ of the monocrystal 150 has been reached, the regulation of the power can be transposed to customary methods.

The invention claimed is:

1. A method for pulling a single crystal by the FZ method in which a polycrystal is melted by means of an electromagnetic melting apparatus and then recrystallized, comprising:
in a first phase ($P_1$), melting a lower end of the polycrystal by means of the melting apparatus,
in a second phase ($P_2$), attaching a monocrystalline seed to a lower end of the polycrystal, and
in a third phase ($P_3$), forming a thin neck section between a lower section of the seed and the polycrystal, where the diameter ($d_D$) of the thin neck section is smaller than the diameter ($d_1$) of the seed,
dynamically adapting a power of the melting apparatus before the third phase ($P_3$) at least temporarily in dependence on a position of a lower phase boundary ($P_U$) between liquid material and solid material on the seed,
dynamically adapting the power of the melting apparatus during the third phase ($P_3$) at least temporarily in dependence on a position of an upper phase boundary ($P_O$) between liquid material and solid material on the part of the polycrystal, and
directly performing a change in the dependence of the power of the melting apparatus from the position of the lower phase boundary ($P_U$) to dependence on the position of the upper phase boundary ($P_O$).

2. The method of claim 1, where the change in the dependence on the position of the lower phase boundary ($P_U$) to the dependence on the position of the upper phase boundary ($P_O$) takes place before an increase in a rate at which the seed and/or the polycrystal are moved in the vertical direction.

3. The method of claim 1, further comprising in a fourth phase ($P_4$), forming a conical section between the thin neck section and the polycrystal, and dynamically adapting the power of the melting apparatus during the fourth phase ($P_4$) at least temporarily in dependence on a characteristic variable from which it is possible to deduce an angle ($\varphi$) of inclination of the conical section.

4. The method of claim 2, further comprising in a fourth phase ($P_4$), forming a conical section between the thin neck section and the polycrystal, and dynamically adapting the power of the melting apparatus during the fourth phase ($P_4$) at least temporarily in dependence on a characteristic variable from which it is possible to deduce an angle ($\varphi$) of inclination of the conical section.

5. The method of claim 3, where the characteristic variable used is one or more of the angle of inclination of the conical section of crystallized material, an angle of inclination of the conical section at a triple point between solid material, liquid material and surroundings, a change in a diameter of the conical section, or the diameter of the conical section at the lower phase boundary.

6. The method of claim 3, further comprising, during the adaptation of the power of the melting apparatus, performing a change in the dependence on the position of the upper phase boundary ($P_O$) directly to the dependence on the characteristic variable, or temporarily adapting the power of the melting apparatus at the same time in dependence on the position of the upper phase boundary ($P_O$) and in dependence on the characteristic variable.

7. The method of claim 3, where the change in the dependence on the position of the upper phase boundary ($P_O$) to the dependence on the characteristic variable takes place as soon as a recognition of the position of the upper phase boundary ($P_O$) is subsequently possible only with less than a predetermined accuracy.

8. The method of claim 3, further comprising determining the characteristic variable for the angle ($\varphi$) of inclination of the conical section by using a camera which is disposed below the melting apparatus.

9. The method of claim 1, further comprising taking into account the positions of the lower phase boundary ($P_U$) and/or of the upper phase boundary ($P_O$) each as the distance ($h_U$, $h_O$) of the respective phase boundary to a fixed reference point ($P_B$) on the melting apparatus.

10. The method of claim 1, further comprising taking into account the position of the lower phase boundary ($P_U$) by using a camera which is disposed below the melting apparatus.

11. The method of claim 1, further comprising taking into account the position of the upper phase boundary ($P_O$) by using a camera which is disposed above the melting apparatus.

* * * * *